(12) United States Patent
Noda et al.

(10) Patent No.: US 7,825,027 B2
(45) Date of Patent: Nov. 2, 2010

(54) METHOD FOR MANUFACTURING MEMORY DEVICE

(75) Inventors: Takafumi Noda, Matsumoto (JP); Toshihiko Higuchi, Kai (JP)

(73) Assignee: Seiko Epson Corporation (JP)

( * ) Notice: Subject to any disclaimer, the term of this patent is extended or adjusted under 35 U.S.C. 154(b) by 46 days.

(21) Appl. No.: 12/271,364

(22) Filed: Nov. 14, 2008

(65) Prior Publication Data

US 2009/0137065 A1 May 28, 2009

(30) Foreign Application Priority Data

Nov. 26, 2007 (JP) ............................. 2007-304535

(51) Int. Cl.
*H01L 21/302* (2006.01)
*H01L 21/461* (2006.01)
(52) U.S. Cl. .................... 438/691; 438/3; 257/E21.214
(58) Field of Classification Search .................... 438/3, 438/691; 257/E21.214
See application file for complete search history.

(56) References Cited

U.S. PATENT DOCUMENTS 6,004,839 A * 12/1999 Hayashi et al. ............. 438/210
6,218,197 B1    4/2001  Kasai
6,380,047 B1 *  4/2002  Bandyopadhyay et al. .. 438/427
6,465,826 B2   10/2002  Kasai
2003/0127703 A1 * 7/2003 Hikosaka et al. ............ 257/520
2008/0265298 A1 * 10/2008 Ozaki ......................... 257/295

FOREIGN PATENT DOCUMENTS

| JP | 10-284702   | 10/1998 |
| JP | 2000-216353 | 8/2000  |
| JP | 2001-015703 | 1/2001  |
| JP | 2005-051135 | 2/2005  |
| JP | 2005-064314 | 3/2005  |
| JP | 2006-121026 | 5/2006  |

* cited by examiner

*Primary Examiner*—Jarrett J Stark
(74) *Attorney, Agent, or Firm*—Harness, Dickey & Pierce, P.L.C.

(57) ABSTRACT

A method for manufacturing a memory device including a ferroelectric memory array region and a logic circuit region is provided. The method includes the steps of: forming, above a base substrate, a plurality of ferroelectric capacitors in the ferroelectric memory array region; forming a wiring layer above the base substrate in the logic circuit region; forming an interlayer dielectric layer that covers the ferroelectric capacitors and the wiring layer; etching the interlayer dielectric layer formed at least in the ferroelectric memory array region to form a concave section; polishing the interlayer dielectric layer by a CMP (chemical mechanical polishing) method; etching the interlayer dielectric layer above the ferroelectric capacitors and the wiring layer to form contact holes; and forming contact sections in the contact holes.

7 Claims, 7 Drawing Sheets

METHOD FOR MANUFACTURING MEMORY DEVICE

The entire disclosure of Japanese Patent Application No. 2007-304535, filed Nov. 26, 2007 is expressly incorporated by reference herein.

BACKGROUND

1. Technical Field

The present invention relates to methods for manufacturing memory devices.

2. Related Art

Due to recent development of the so-called SOC (System On Chip) technology, memory devices that integrate ferroelectric memory (e.g., ferroelectric random access memory: FeRAM) cells and structures having other functions, more specifically, logic circuits that perform operation processing for the ferroelectric memory cells into a single chip are known. For example, Japanese Laid-open Patent Application JP-A-2006-121026 is an example of related art. Ferroelectric capacitors composing the ferroelectric memory cells are required to have high level of accuracy.

SUMMARY

In accordance with an advantage of some aspects of the present invention, it is possible to provide a method for manufacturing memory devices having highly reliable ferroelectric capacitors with excellent characteristics.

A method for manufacturing a memory device in accordance with an embodiment of the invention pertains to a method for manufacturing a memory device including a ferroelectric memory array region and a logic circuit region, and the method includes the steps of: forming, above a base substrate, a plurality of ferroelectric capacitors in the ferroelectric memory array region; forming a wiring layer above the base substrate in the logic circuit region; forming an interlayer dielectric layer that covers the ferroelectric capacitors and the wiring layer; etching the interlayer dielectric layer formed at least in the ferroelectric memory array region to form a concave section; polishing the interlayer dielectric layer by a CMP (chemical mechanical polishing) method; etching the interlayer dielectric layer above the ferroelectric capacitors and the wiring layer to form contact holes; and forming contact sections in the contact holes.

In accordance with the method for manufacturing a memory device in accordance with the embodiment of the invention, the interlayer dielectric layer formed in the ferroelectric memory array region is provided with a concave section, such that a memory device having high reliable ferroelectric capacitors with excellent characteristics can be provided.

In the description of the invention, the term "above" is used, for example, as in a statement "a specific component (hereinafter called 'B') is formed "above" another specific component (hereinafter called 'A')." In such a case, the term "above" is used in the description of the invention, while assuming to include the case where the component B is formed directly on the component A and the case where the component B is formed over the component A through another component provided on the component A.

In the method for manufacturing a memory device in accordance with an aspect of the embodiment of the invention, the base substrate may be formed by the steps of: forming a first transistor in the ferroelectric memory array region of a substrate; forming a second transistor in the logic circuit region of the substrate; forming an interlayer dielectric layer that covers the first transistor and the second transistor; etching the interlayer dielectric layer to form contact holes; and forming contact sections in the contact holes.

In the method for manufacturing a memory device in accordance with an aspect of the embodiment of the invention, the ferroelectric memory array region may be formed to have a smaller area compared to the logic circuit region.

DESCRIPTION OF EXEMPLARY EMBODIMENTS

Preferred embodiments of the invention are described below with reference to the accompanying drawings.

1. Memory Device

Figure 1:
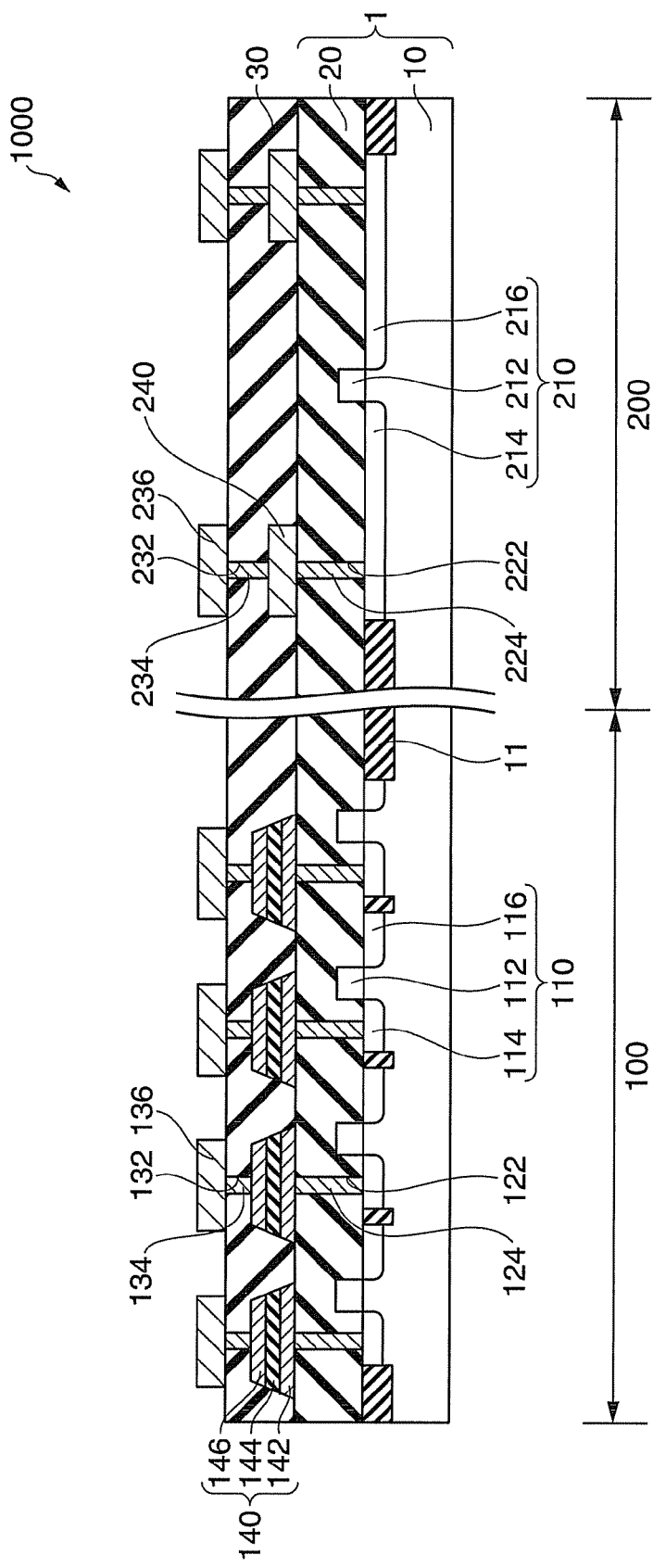
FIG. 1 is a schematic cross-sectional view of a memory device in accordance with an embodiment of the invention.
Figure 2:
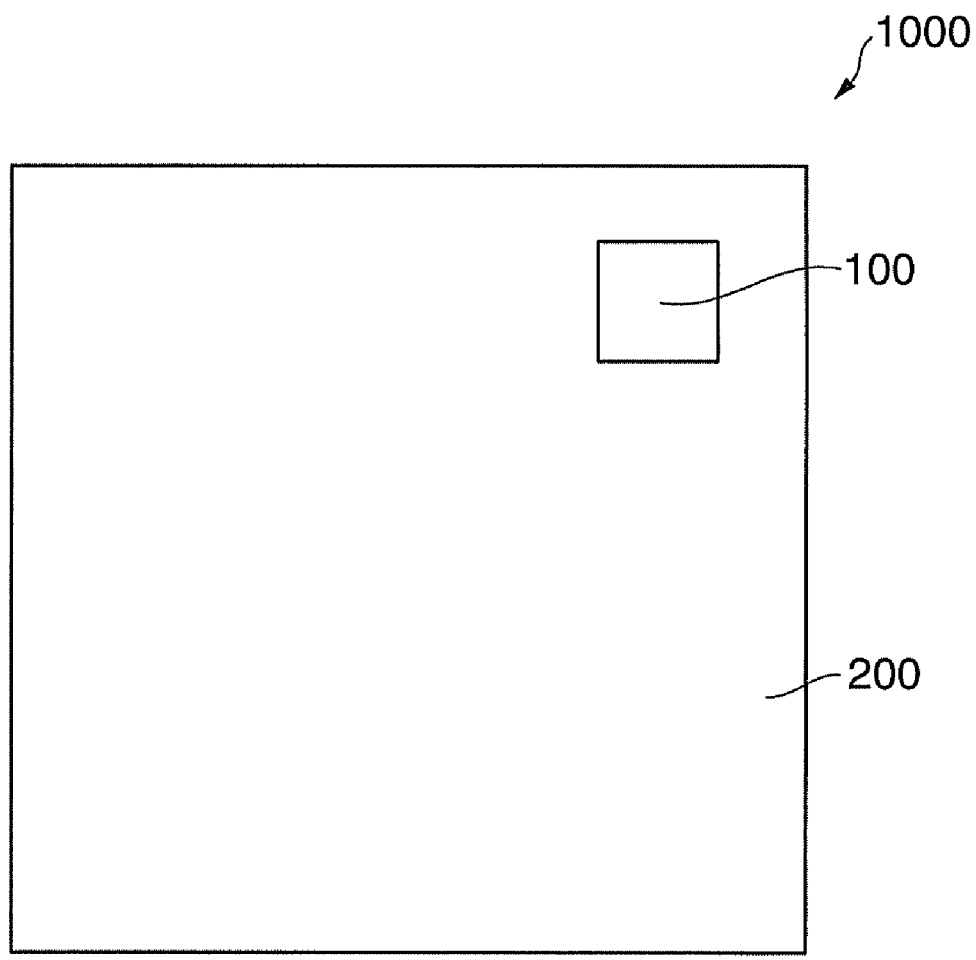
FIG. 2 is a schematic plan view of the memory device in accordance with the embodiment of the invention.

First, a memory device obtained by the manufacturing method in accordance with an embodiment of the invention is described. FIG. 1 and FIG. 2 are a schematic cross-sectional view and a schematic plan view of a memory device 1000 in accordance with an embodiment of the invention. It is noted that, in FIG. 2, a ferroelectric memory array region 100 and a logic circuit region 200 alone are illustrated.

The memory device 1000 includes a ferroelectric memory array region 100 and a logic circuit region 200, as shown in FIG. 1 and FIG. 2.

The ferroelectric memory array region 100 and the logic circuit region 200 are formed in a single chip. In other words, the memory device 1000 is a ferroelectric memory array/logic circuit mix-mounted chip.

As shown in FIG. 1, the memory device 1000 includes a base substrate 1, ferroelectric capacitors 140, wiring layers 240, an interlayer dielectric layer 30, contact holes 132 and 232, and contact sections 134 and 234.

The base substrate 1 may include a substrate 10, element isolation regions 11, first transistors 110, second transistors 210, an interlayer dielectric layer 20, contact holes 122 and 222, and contact sections 124 and 224.

For example, a single crystal silicon substrate may be used as the substrate 10.

The element isolation regions 11 are formed in the substrate 10. The element isolation regions 11 may be formed from, for example, trench dielectric layers, semi-recess LOCOS (Local Oxidation of Silicon) layers, or LOCOS layers. The element isolation regions 11 function to electrically insulate and isolate the substrate 10.

The first transistors 110 are formed in the ferroelectric memory array region 100 of the substrate 10. The first transistors 110 are formed in a region that is defined by the element isolation regions 11. The first transistors 110 are formed in plurality, and their number is not particularly limited. The first transistors 110 are electrically connected to ferroelectric capacitors 140. Each of the first transistors 110 may be electrically connected to, for example, each of the ferroelectric capacitors 140, thereby composing a 1T1C type ferroelectric memory having a stacked structure. Each of the first transistors 110 has a gate 112, a source 114 and a drain 116.

The second transistor 210 is formed in the logic circuit region 200 of the substrate 10. The second transistor 210 is formed in a region that is defined by the element isolation regions 11. Although not illustrated, for example, the second transistors 210 may be formed in plurality. The second transistor 210 has a gate 212, a source 214 and a drain 216.

In the logic circuit region 200, for example, a logic circuit composed of the second transistors 210 may be formed. The logic circuit may be, for example, a circuit that performs calculation and operation control for the ferroelectric memories, and may include a decoding circuit that controls electrical operation of the ferroelectric memories. In addition, although not shown, semiconductor elements, such as, for example, gate arrays, resistances, capacitors, DRAMs (Dynamic Random Access Memories), SRAMs (Static Random Access Memories) and the like may be formed in the logic circuit region 200. In other words, the memory device 1000 may be a mix-mounting type memory device that mixes and mounts the semiconductor elements described above.

The interlayer dielectric layer 20 is formed in a manner to cover the first transistors 110 and the second transistor 210. The interlayer dielectric layer 20 may be composed of, for example, silicon oxide. The thickness of the interlayer dielectric layer 20 may be, for example, 1 μm-2 μm.

The contact holes 122 are formed in the ferroelectric memory array region 100 and in the interlayer dielectric layer 20. The contact holes 122 may be formed, for example, penetrating the interlayer dielectric layer 20 on the sources 114. The contact holes 222 are formed in the logic circuit region 200 and in the interlayer dielectric layer 20. The contact holes 222 may be formed, for example, penetrating the interlayer dielectric layer 20 on the source 214 and the drain 216, but may be formed on the gate 212 without being limited to the above.

The contact sections 124 and 224 are formed in the contact holes 122 and 222, respectively. The contact sections 124 and 224 may be formed from conductive material, such as, for example, copper, aluminum and the like. For example, the first transistors 110 and the ferroelectric capacitors 140, and the second transistor 210 and the wiring layers 240 can be electrically connected by the contact sections 124 and 224, respectively.

The ferroelectric capacitors 140 are formed in the ferroelectric memory array region 100 on the interlayer dielectric layer 20. The ferroelectric capacitors 140 may be formed, for example, on the contact sections 124, respectively. The ferroelectric capacitors 140 are formed in plurality without any particular limitation to their number, and form a ferroelectric memory array. The ferroelectric memory array may be formed from the ferroelectric capacitors 140, for example, each having a thickness of about 700 nm, arranged at specified intervals in a matrix, in a so-called densely arranged state. The interval between the ferroelectric capacitors 140 is smaller, for example, than the interval between the wiring layers 240 that are formed in the logic circuit region 200. In other words, the ferroelectric capacitors 140 are formed in higher density in specified areas in the ferroelectric memory array region 100 than in the logic circuit region 200. It is noted that the ferroelectric memory array region 100 has a smaller area than that of the logic circuit region 200 as viewed in a plan view, for example, as shown in FIG. 2. The ferroelectric memory array region 100 may be a region having, for example, 1%-10% of the entire area of the memory device 1000, as in a plan view. In other words, the multiple ferroelectric capacitors 140 are regularly formed in a high density in the ferroelectric memory array region 100 that has a smaller area than that of the logic circuit region 200.

The ferroelectric capacitor 140 has a lower electrode layer 142, a ferroelectric layer 144 formed on the lower electrode layer 142, and an upper electrode layer 146 formed on the ferroelectric layer 144.

The lower electrode layer 142 and the upper electrode layer 146 may be composed of, for example, platinum, iridium, an alloy of the foregoing metal or a conductive oxide of the foregoing metal. The lower electrode layer 142 and the upper electrode layer 146 may each be in a single layer of the foregoing exemplified material, or have a laminate structure of plural materials. Each of the lower electrode layer 142 and the upper electrode layer 146 may have a thickness of, for example, 50 nm-500 nm.

The ferroelectric layer 144 may be composed of ferroelectric material of perovskite type oxide. The ferroelectric layer 144 may be composed of, for example, lead zirconate titanate (Pb (Zr,Ti) $O_3$:PZT) or lead zirconate titanate niobate (Pb (Zr, Ti, Nb) $O_3$:PZTN). The thickness of the ferroelectric layer 144 may be, for example, 50 nm-500 nm.

The wiring layers 240 are formed in the logic circuit region 200 on the interlayer dielectric layer 20. The wiring layers 240 may be formed, for example, on the contact sections 224. The wiring layer 240 may be formed to have a width greater than the width of the contact sections 224 and 234, or may be formed to have the same width as that of the contact sections 224 and 234. The wiring layer 240 may be, for example, a part of the contact section 232. In other words, the contact section 234 may be formed directly on the contact section 224. The wiring layer 240 may be composed of conductive material, such as, for example, copper, aluminum or the like. It is noted that the wiring layers 240 may be formed not only from normal wiring layers composed of conductive material, but also from capacitance elements having a ferroelectric capacitor laminate structure that may be used for other than memories.

The interlayer dielectric layer 30 is formed in a manner to cover the ferroelectric capacitors 140 and the wiring layers 240. The interlayer dielectric layer 30 may be composed of silicon oxide, for example. The thickness of the interlayer dielectric layer 30 may be, for example, 1 μm-2 μm.

The contact holes 132 are formed, penetrating the interlayer dielectric layer 30 on the upper electrode layers 146. The contact holes 232 are formed, penetrating the interlayer dielectric layer 30 on the wiring layers 240.

Contact sections 134 and 234 are formed in the contact holes 132 and 232, respectively. Wiring layers 136 and 236 are formed on the contact sections 134 and 234, respectively. The contact sections 134 and 234 and the wiring layers 136 and 236 may be composed of conductive material, such as, for example, copper, aluminum or the like. The ferroelectric capacitors 140 may be electrically connected to the wiring layers 136, and the wiring layers 240 to the wiring layers 236, by the contact sections 134 and 234, respectively.

2. Method for Manufacturing Memory Device

Next, a method for manufacturing a memory device in accordance with an embodiment of the invention is described with reference to the accompanying drawings. FIGS. 3-7 are cross-sectional views schematically showing a process of manufacturing a memory device 1000 in accordance with the present embodiment.

Figure 3:
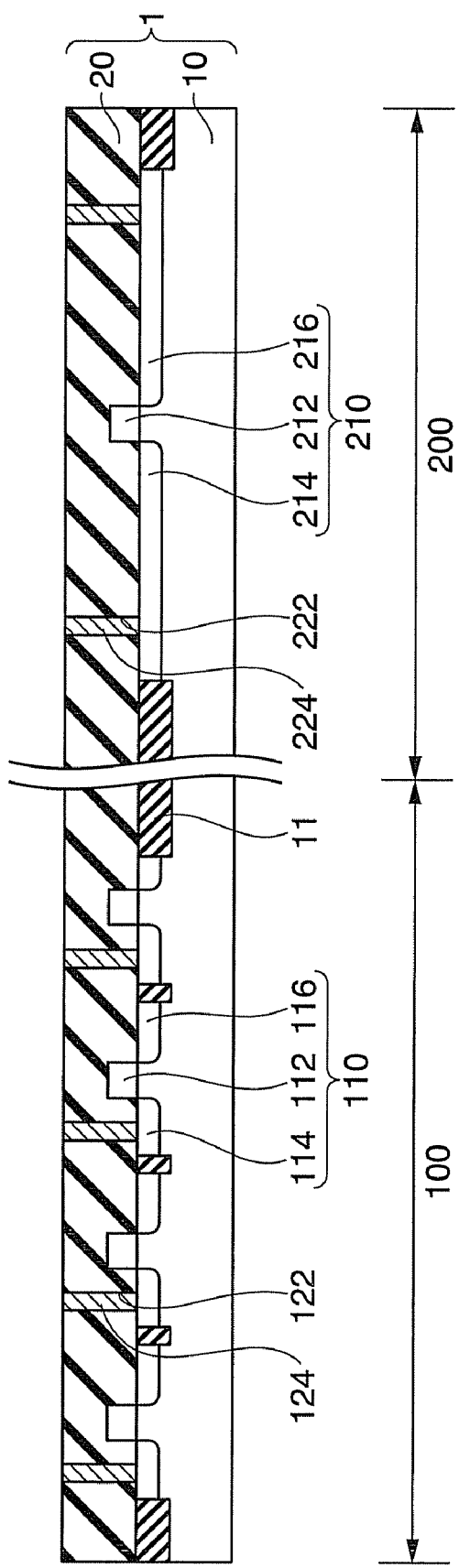
FIG. 3 is a schematic cross-sectional view showing a step for manufacturing a memory device in accordance with an embodiment of the invention.

As shown in FIG. 3, element isolation regions 11 are formed in a substrate 10. The element isolation regions 11 may be formed by a known method, such as, for example, a STI (shallow trench isolation) method, a semi recess LOCOS method, or a LOCOS method.

Next, first transistors 110 are formed in a ferroelectric memory array region 100 of the substrate. Also, second transistors 210 are formed in a logic circuit region 200 of the substrate 10. The first transistors 110 and the second transistors 210 may be formed by, for example, a known method.

Next, an interlayer dielectric layer 20 is formed over the entire surface in a manner to cover the first transistors 110 and the second transistors 210. The interlayer dielectric layer 20 may be formed by, for example, a spin coat method. The interlayer dielectric layer 20 may be formed through, for example, forming an interlayer dielectric layer and then planarizing the layer by a CMP method.

Next, the interlayer dielectric layer 20 is patterned thereby forming contact holes 122 in the ferroelectric memory array region 100. At the same time, contact holes 222 are formed in the logic circuit region 200. The patterning may be conducted by, for example, known photolithography technique and etching technique. The contact holes 122 may be formed, for example, in a manner that sources 114 are exposed. The contact holes 222 are formed, for example, in a manner that a source 214 and a drain 216 are exposed.

Next, contact sections 124 and 224 are formed in the contact holes 122 and 222, respectively. The contact sections 124 and 224 may be formed by, for example, a sputter method or a plating method.

Figure 4:
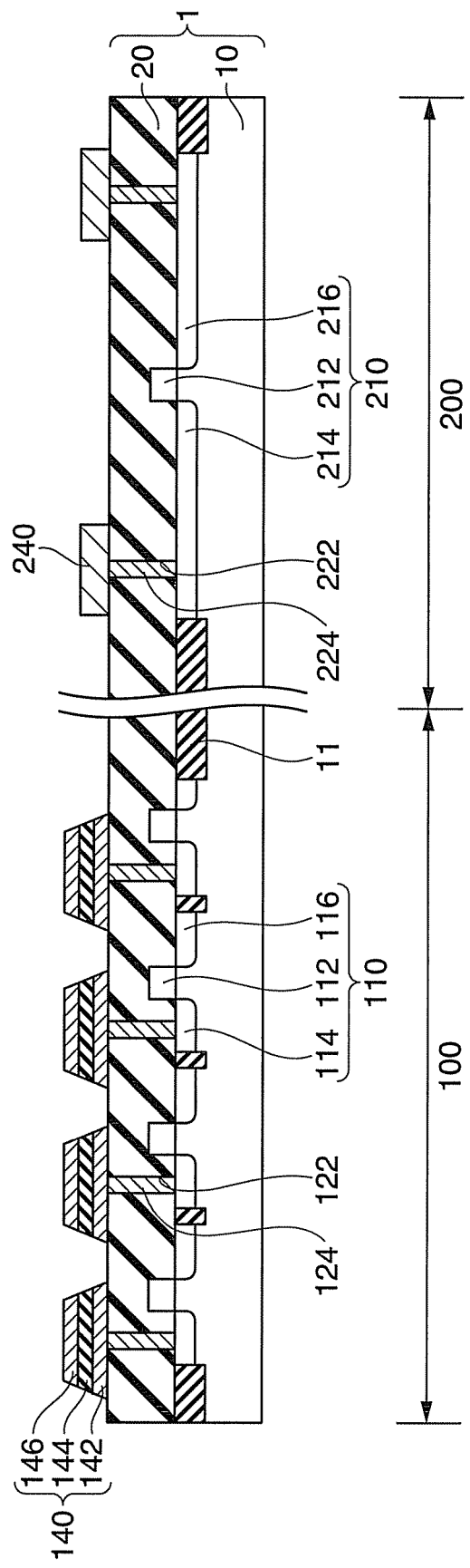
FIG. 4 is a schematic cross-sectional view showing a step for manufacturing the memory device in accordance with the present embodiment.

As shown in FIG. 4, ferroelectric capacitors 140 are formed on the interlayer dielectric layer 20 in the ferroelectric memory array region 100. The ferroelectric capacitors 140 may be formed, for example, on the contact sections 124. The ferroelectric capacitors 140 are formed by sequentially laminating a lower electrode layer 142, a ferroelectric layer 144 and an upper electrode layer 146.

The lower electrode layer 142 and the upper electrode layer 146 may be formed by, for example, a sputter method, a plating method, or a vacuum vapor deposition method. The ferroelectric layer 144 may be formed by, for example, a sol-gel method, a chemical vapor deposition (CVD) method, a metal organic decomposition (MOD) method, or a sputter method.

Also, as shown in FIG. 4, wiring layers 240 are formed on the interlayer dielectric layer 20 in the logic circuit region 200. The wiring layers 240 may be formed, for example, on the contact sections 224. The wiring layers 240 may be formed by, for example, a sputter method, or a plating method.

Figure 5:
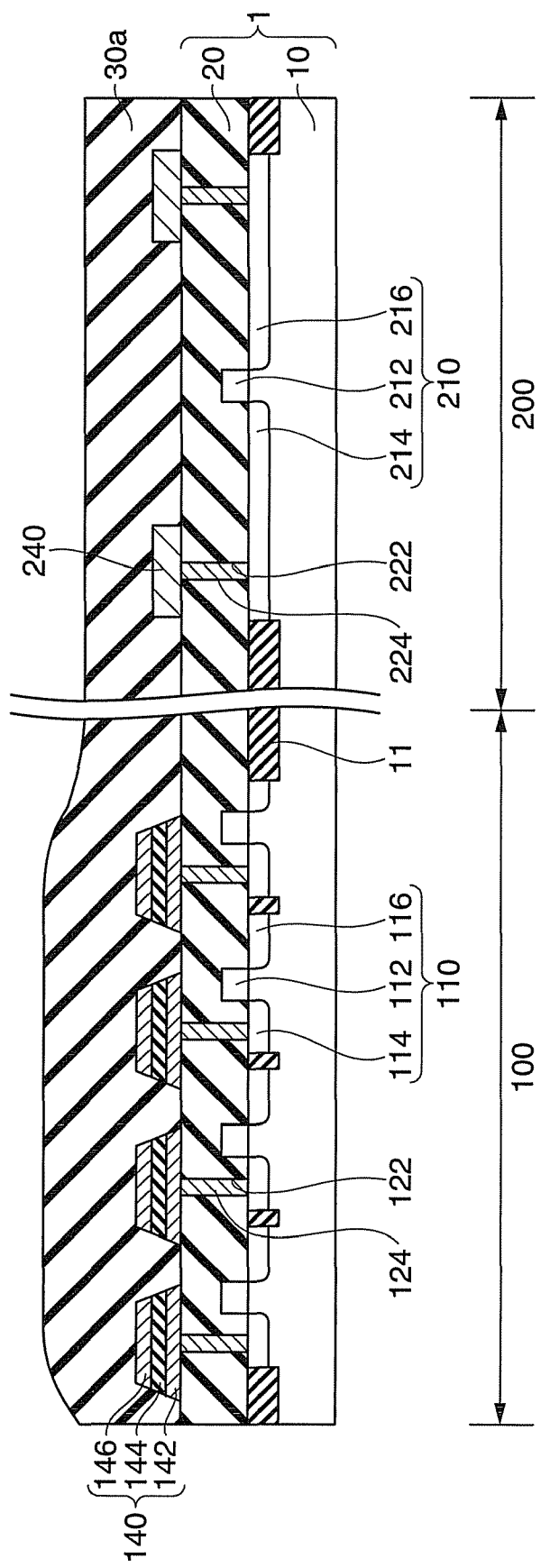
FIG. 5 is a schematic cross-sectional view showing a step for manufacturing the memory device in accordance with the present embodiment.

As shown in FIG. 5, an interlayer dielectric layer 30a is formed over the entire surface in a manner to cover the ferroelectric capacitors 140 and the wiring layers 240. As described above, the multiple ferroelectric capacitors 140 are formed in higher density in a specified area in the ferroelectric memory array region 100 than in the logic circuit region 200. As a result, a portion of the interlayer dielectric layer 30a formed in the ferroelectric memory array region 100 becomes higher than a portion of the interlayer dielectric layer 30 formed in the logic circuit region 200. It is noted that the ferroelectric memory array region 100 is a region having a smaller area than that of the logic circuit region 200 as viewed in a plan view, for example, as shown in FIG. 2. Therefore, the memory device 1000 has, for example, a locally higher area in the interlayer dielectric layer 30a (in the ferroelectric memory array region 100).

Figure 6:
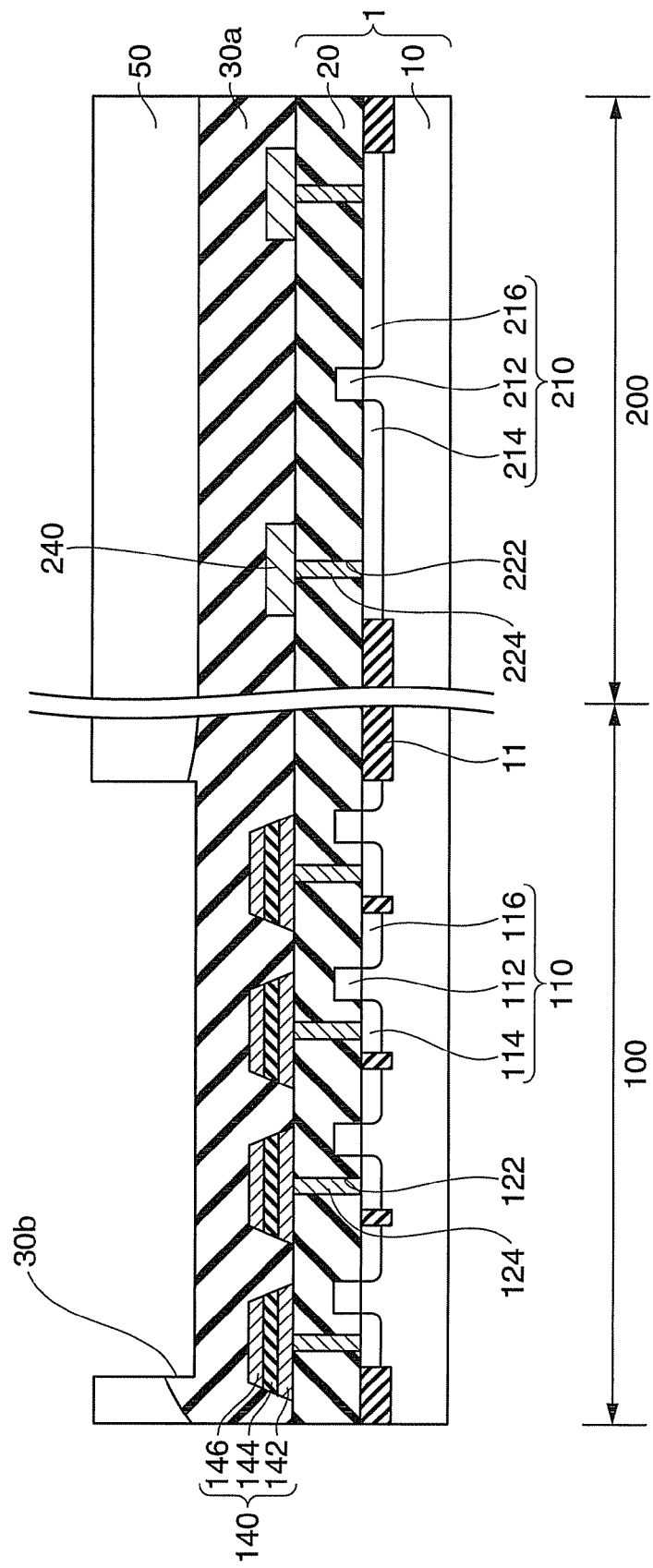
FIG. 6 is a schematic cross-sectional view showing a step for manufacturing the memory device in accordance with the present embodiment.

As shown in FIG. 6, the interlayer dielectric layer 30a formed at least in the ferroelectric memory array region 100 is patterned, thereby forming a concave section 30b. The patterning may be conducted such that the portion of the interlayer dielectric layer 30a having the concave section 30b formed therein is generally in the same height as that of the interlayer dielectric layer 30a formed in the logic circuit region 200. The patterning may be conducted by photolithography technique and etching technique. A resist 50 to be used as a mask for the patterning may have a pattern inverted from (an inverted pattern of) a pattern of the mask used for patterning the ferroelectric capacitors 140. For example, the inverted pattern can be automatically generated by algorithm.

Figure 7:
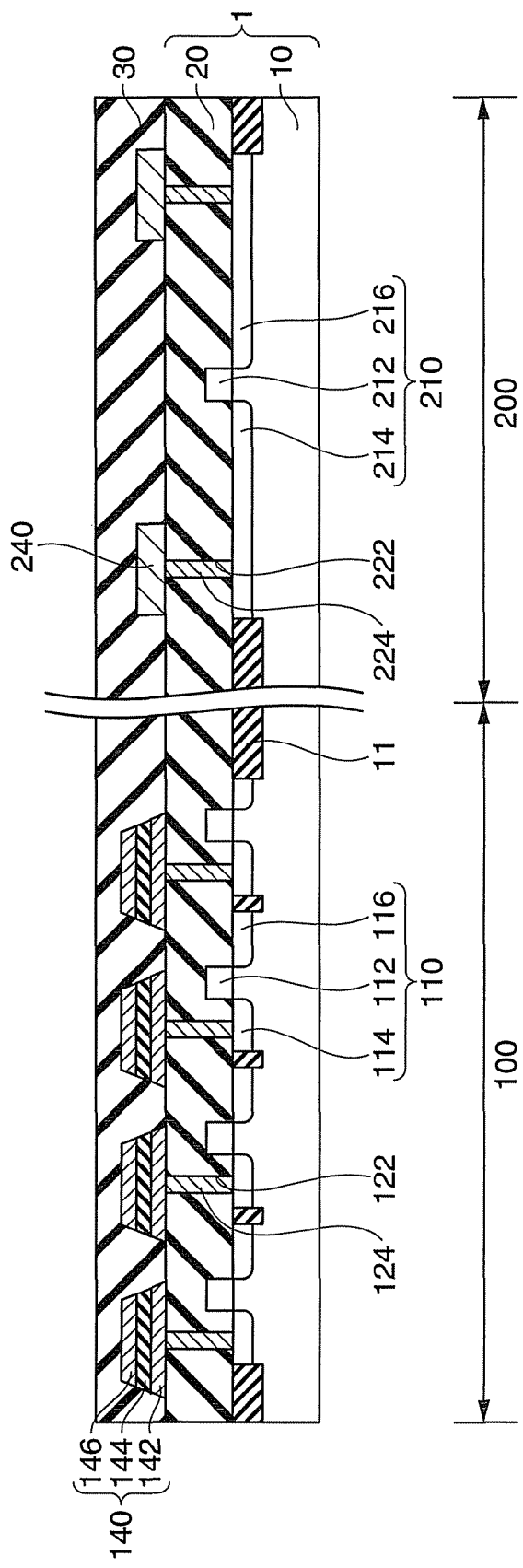
FIG. 7 is a schematic cross-sectional view showing a step for manufacturing the memory device in accordance with the present embodiment.

As shown in FIG. 7, the interlayer dielectric layer 30a is polished and planarized by a CMP method. When the interlayer dielectric layer has portions with different heights, differences may be caused in the polishing rates. However, as the concave section 30b is formed in the interlayer dielectric layer 30a formed in the ferroelectric memory array region 100, differences would be difficult to occur in the polishing rate between the ferroelectric memory array region 100 and the logic circuit region 200. Therefore, the interlayer dielectric layer 30 can be formed with a high level of surface flatness. The memory device 1000 has a locally higher region in the interlayer dielectric layer 30a (the ferroelectric memory array region 100) as described above. Therefore, if the concave section 30b were not formed, the interlayer dielectric layer may be formed with a very low level of surface flatness.

As shown in FIG. 1, the interlayer dielectric layer 30 on the upper electrodes 146 is patterned to form contact holes 132. At the same time, the interlayer dielectric layer 30 on the wiring layers 240 is patterned to form contact holes 232. The patterning may be conducted by, for example, known photolithography technique and etching technique. Because the interlayer dielectric layer 30 has the surface with a high level of surface flatness as described above, the contact holes 132 and 232 can be formed with high accuracy. In other words, for example, the probability of occurrences of excessive over-etching or insufficient etching can be lowered.

Next, contact sections 134 and 234 are formed in the contact holes 132 and 232, respectively. Then, wirings 136 and 236 are formed on the contact sections 134 and 234, respectively. The contact sections 134 and 234 and the wirings 136 and 236 may be formed by, for example, a sputter method or a plating method.

By the process described above, the memory device 1000 is manufactured.

The method for manufacturing a memory device 1000 in accordance with the present embodiment has, for example, the following characteristics.

According to the method for manufacturing a memory device 1000, the concave section 30b is formed in the interlayer dielectric layer 30a that is formed in the ferroelectric memory array region 100. Therefore, the interlayer dielectric layer 30 with a high level of surface flatness can be formed while substantially no differences occur in the rate of polishing in a CMP method between the ferroelectric memory array region 100 and the logic circuit region 200. As a result, the contact holes 132 and 232 with high accuracy can be formed. In other words, for example, the probability of occurrences of excessive over-etching or insufficient etching can be lowered. In particular, the formation of the contact holes 132 on the upper electrode layers 146 has substantial impact on the characteristics of the ferroelectric capacitors 140. For example, differences in the amount of etching in forming the contact holes 132 may cause differences in the amount of etching damage entered in the upper electrode layers 146 and differences in the configuration of the upper electrode layers 146. As a result, the characteristics of the ferroelectric capacitors 140 may vary, and their reliability may lower. Accordingly, the formation of the contact holes 132 requires a high level of accuracy. According to the method for manufacturing a memory device 1000, the problems described above can be avoided, and memory devices 1000 having highly reliable ferroelectric capacitors 140 with excellent characteristics can be obtained.

The embodiments of the invention are described above in detail. However, those skilled in the art should readily understand that many modifications can be made without departing in substance from the novel matter and effects of the invention. Accordingly, all of those modified examples are deemed to be included in the scope of the invention.

What is claimed is:

1. A method for manufacturing a memory device comprising:
    forming, above a base substrate, a plurality of ferroelectric capacitors in a ferroelectric memory array region to provide the ferroelectric memory array region with a high density of ferroelectric capacitors relative to a logic circuit region;
    forming a wiring layer above the base substrate in the logic circuit region, the logic circuit region entirely surrounding the ferroelectric memory array region when viewed in plan;
    forming an interlayer dielectric layer that entirely covers the ferroelectric memory array region and the logic circuit region, a height of the interlayer dielectric layer relative to the base substrate in the ferroelectric memory array region being greater than a height of the interlayer dielectric layer relative to the base substrate in the logic circuit region due to the high density of ferroelectric capacitors;
    etching the interlayer dielectric layer formed at least in the ferroelectric memory array region to form a concave section that lowers the height of the interlayer dielectric layer in the ferroelectric memory array region to proximate the height of the interlayer dielectric layer in the logic circuit region;
    polishing the interlayer dielectric layer by a CMP (chemical mechanical polishing) method so that the height of the interlayer dielectric layer in the ferroelectric memory array region is equal to the height of the interlayer dielectric layer in the logic circuit region;
    etching the interlayer dielectric layer above the ferroelectric capacitors and the wiring layer to form contact holes; and
    forming contact sections in the contact holes.

2. A method for manufacturing a memory device according to claim 1, wherein the base substrate is formed by:
    forming a first transistor in the ferroelectric memory array region of a substrate;
    forming a second transistor in the logic circuit region of the substrate;
    forming an interlayer dielectric layer that covers the first transistor and the second transistor;
    etching the interlayer dielectric layer to form contact holes; and
    forming contact sections in the contact holes.

3. A method for manufacturing a memory device according to claim 1, wherein the ferroelectric memory array region is formed to have a smaller area compared to the logic circuit region in a plan view.

4. The method of claim 1, wherein an area at which the interlayer dielectric layer is etched is smaller than an area where the interlayer dielectric layer is not etched.

5. The method of claim 1, wherein the contact holes formed above the ferroelectric capacitors and the wiring layer are formed simultaneously.

6. The method of claim 1, wherein the interlayer dielectric layer above the ferroelectric memory array region is etched, and the interlayer dielectric layer above the logic circuit region is not etched.

7. The method of claim 1, wherein the interlayer dielectric layer is etched using a mask having a pattern that is inverted from a mask used for patterning the ferroelectric capacitors.

* * * * *